United States Patent
Kunimune et al.

(10) Patent No.: US 10,593,851 B2
(45) Date of Patent: Mar. 17, 2020

(54) METAL POWDER SINTERING PASTE, METHOD FOR PRODUCING THE SAME, AND METHOD FOR PRODUCING CONDUCTIVE MATERIAL

(71) Applicant: NICHIA CORPORATION, Anan-shi, Tokushima (JP)

(72) Inventors: Teppei Kunimune, Tokushima (JP); Masafumi Kuramoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 12 days.

(21) Appl. No.: 15/964,568

(22) Filed: Apr. 27, 2018

(65) Prior Publication Data

US 2018/0315913 A1   Nov. 1, 2018

(30) Foreign Application Priority Data

Apr. 28, 2017   (JP) ................. 2017-090197

(51) Int. Cl.
*H01B 1/16*     (2006.01)
*H01L 33/62*    (2010.01)
*H01B 1/22*     (2006.01)
*B23K 35/30*    (2006.01)
*B22F 1/00*     (2006.01)
(Continued)

(52) U.S. Cl.
CPC ............ *H01L 33/62* (2013.01); *B22F 1/0003* (2013.01); *B22F 1/0014* (2013.01);
(Continued)

(58) Field of Classification Search
CPC ....... H01L 2924/00; H01L 2924/00014; H01L 2924/00013; H01L 2224/48247; H01L 2224/48465; H01L 2224/29387; H01L 2224/45144; H01L 2224/85205; H01L 2924/0665; H01L 2924/00012; H01L 2924/1079; H01L 2224/2919; H01L 2224/45014; H01L 2224/45124; H01L 2224/48091; H01L 2224/49111; H01L 2224/49175; H01L 2924/01014; H01L 2924/01015; H01L 2924/0132; H01L 2224/29339; H01L 2224/83439; H01L 2224/8384; H01L 24/29; H01L 24/83; H01L 2924/014; H01L 2224/05639; H01L 2224/05644; H01L 2224/05655; H01L 2224/29101; H01L 2224/29344; H01L 222/29347; H01L 2224/29364; H01L 2224/29369; H01L 2224/29384; H01L 2224/294; H01L 2224/29455; H01L 2224/32225; H01L 2224/32245; H01L 2224/325; H01L 2224/37147; H01L 2224/73265; H01L 2224/83138; H01L 2224/83203; H01L 2224/83444; H01L 2224/83455; H01L 2224/83805; H01L 2924/00011; H01L 2924/01028; H01L 2924/01322; H01L 2924/05432; H01L 2924/12043; H01L 2924/1305; H01L 2824/1306; H01L 2924/13091; H01L 2924/181; H01L 2224/04026; H01L 2224/05099; H01L 2224/05599; H01L 2224/13099; H01L 2224/13599; H01L 2224/16225; H01L 2224/29099; H01L 2224/29239; H01L 2224/29599; H01L 2224/73204; H01L 2224/83205; H01L 2224/83801; H01L 24/32; H01L 2924/00015; H01L 2924/01005; H01L 2924/01006; H01L 2924/01013; H01L 2924/01026; H01L 2924/01029; H01L 2924/01032; H01L 2924/01033; H01L 2924/01047; H01L 2924/01049; H01L 2924/01074; H01L 2924/01078; H01L 2924/01082; H01L 2924/05032; H01L 2924/053; H01L 2924/10253; H01L 2924/206; H01L 2924/3512; H01L 21/4867; H01L 2224/0603; H01L 2224/26125; H01L 2224/274;
(Continued)

(56) References Cited

U.S. PATENT DOCUMENTS 5,232,962 A * 8/1993 Dershem .................... C09J 5/00
                                                         257/E21.503
2009/0189264 A1   7/2009 Yato et al.
(Continued)

FOREIGN PATENT DOCUMENTS

EP   2 743 973 A2   6/2014
EP   2816593 A1    12/2014
(Continued)

OTHER PUBLICATIONS

"Alpha-terpineol" https://pubchenn.ncbi.nim.nih.gov/compound/alpha-TERPINEOL#section=Boiling-Point&fullscreen=true 1/ (Year: 2019).*

*Primary Examiner* — Mark Kopec
*Assistant Examiner* — Jaison P Thomas
(74) *Attorney, Agent, or Firm* — Birch, Stewart, Kolasch & Birch, LLP

(57) ABSTRACT

Provided is a metal powder sintering paste having a high resistance to thermal stress. The present invention provides a metal powder sintering paste containing silver particles having an average particle diameter (median diameter) of 0.3 μm to 5 μm as a main component, further containing inorganic spacer particles having a CV value (standard deviation/average value) of less than 5%, and containing substantially no resin.

19 Claims, No Drawings

(51) Int. Cl.
  *B23K 35/02* (2006.01)
  *B22F 3/10* (2006.01)
  *H01L 23/00* (2006.01)
  *B23K 35/36* (2006.01)

(52) U.S. Cl.
  CPC .......... *B22F 1/0055* (2013.01); *B22F 1/0074* (2013.01); *B22F 3/1017* (2013.01); *B23K 35/025* (2013.01); *B23K 35/3006* (2013.01); *B23K 35/3606* (2013.01); *B23K 35/3607* (2013.01); *H01B 1/16* (2013.01); *H01B 1/22* (2013.01); *H01L 24/26* (2013.01)

(58) Field of Classification Search
  CPC . H01L 2224/29294; H01L 2224/29309; H01L 2224/29311; H01L 2224/29313; H01L 2224/29316; H01L 2224/29363; H01L 2224/29499; H01L 2224/32506; H01L 2224/33181; H01L 2224/37124; H01L 2224/40091; H01L 2224/40245; H01L 2224/40247; H01L 2224/73219; H01L 2224/73221; H01L 2224/743; H01L 2224/83194; H01L 2224/8385; H01L 2224/83851; H01L 2224/83855; H01L 23/49513; H01L 23/49524; H01L 23/49562; H01L 23/49582; H01L 24/27; H01L 24/37; H01L 24/40; H01L 24/45; H01L 24/48; H01L 24/49; H01L 24/743; H01L 24/84; H01L 2924/01004; H01L 2924/01007; H01L 2924/01022; H01L 2924/0503; H01L 2924/05442; H01L 2924/061; H01L 2924/0675; H01L 2924/068; H01L 2924/069; H01L 2924/07001; H01L 2924/0781; H01L 2924/09701; H01L 2924/10272; H01L 2924/10329; H01L 2924/1033; H01L 2924/10338; H01L 2924/13055; H01L 2924/15787; H01L 2924/30105; H01L 2924/35121; H01B 13/0016; H01B 13/0026; H01B 1/16; H01B 1/22

See application file for complete search history.

(56) References Cited

U.S. PATENT DOCUMENTS

| | | |
|---|---|---|
| 2012/0003465 A1 | 1/2012 | Rittner et al. |
| 2014/0329105 A1 | 11/2014 | Nagamoto |
| 2017/0243849 A1 | 8/2017 | Sasaki et al. |
| 2017/0271294 A1* | 9/2017 | Chen ....................... H01L 24/29 |
| 2018/0301237 A1* | 10/2018 | Yamagami ................ B22F 7/08 |

FOREIGN PATENT DOCUMENTS

| | | |
|---|---|---|
| EP | 2827341 A1 | 1/2015 |
| JP | 2008-10703 A | 1/2008 |
| JP | 2009-206482 A | 9/2009 |
| JP | 2010-170916 A | 8/2010 |
| JP | 2011-71301 A | 4/2011 |
| JP | 2011-198674 A | 10/2011 |
| JP | 2012-515266 A | 7/2012 |
| JP | 2014-33168 A | 2/2014 |
| JP | 2014-63995 A | 4/2014 |
| JP | 5535469 B2 | 7/2014 |
| JP | 2015-185559 A | 10/2015 |
| JP | 2016-56288 A | 4/2016 |
| JP | 5962673 B2 | 8/2016 |
| JP | 60966952 B2 | 1/2017 |
| WO | WO 2013/114930 A1 | 8/2013 |
| WO | WO 2016/063931 A1 | 4/2016 |
| WO | WO 2016/103528 A1 | 6/2016 |

* cited by examiner

METAL POWDER SINTERING PASTE, METHOD FOR PRODUCING THE SAME, AND METHOD FOR PRODUCING CONDUCTIVE MATERIAL

CROSS-REFERENCE TO RELATED APPLICATIONS

The present application claims priority under 35 U.S.C. § 119 to Japanese Patent Application No. 2017-090197, filed Apr. 28, 2017, the contents of which are hereby incorporated by reference in their entirety.

BACKGROUND

1. Field of the Invention

The present invention relates to a metal powder sintering paste, a method for producing the same, and a method for producing a conductive material.

2. Description of Related Art

Conventionally known is a light-emitting device or a power semiconductor device using a light-emitting element as a light source, in which a metal powder sintering paste obtained by dispersing metal particles in a dispersion medium such as an organic solvent is used when a power semiconductor element or the like is disposed on a mounting member of the light-emitting device or the power semiconductor device. The metal powder sintering paste is disposed between the mounting member and the power semiconductor element or the like, and metal particles in the metal powder sintering paste are sintered by heating at around 200° C., and thereby bonding is achieved.

Also, a method in which an adhesive containing resin or lead-free eutectic solder using eutectic crystal is disposed between a light-emitting element and a mounting member is known as a method for bonding a light-emitting element and a mounting member.

However, there is a possibility that a member will deteriorate due to high temperature heating because in general, lead-free solder has a melting point of 300° C. or more, or a member will be damaged due to stress caused by a difference in thermal expansion coefficient between the light-emitting element and the mounting member during cooling after bonding. Thus, with the method using lead-free solder, there is a limited choice of mounting members that can be used, in some cases.

If silver is used as the metal powder in the metal powder sintering paste, for example, the melting point of silver, which is the theoretical heat resistance limit, is about 962° C., but bonding is achieved by heating at around 200° C. Therefore, the metal powder sintering paste is superior to the lead-free eutectic solder using eutectic crystal in light of the bonding temperature and heat resistance of a light-emitting device that is to be obtained.

Also, if the metal powder sintering paste does not contain gold as the metal powder, the metal powder sintering paste is inexpensive compared to gold-tin eutectic solder that is often used to mount a light-emitting element.

There is a metal powder sintering paste containing resin, but in light of the fact that a high temperature is required due to sintering, and that a resin component or the volatile content of resin contaminates peripheral members, a metal powder sintering paste that contains a volatile organic solvent as the dispersion medium and contains no resin is superior.

The method using a metal powder sintering paste is superior to the method using an adhesive containing resin in light of the fact that resin deterioration does not occur, and thus the obtained light-emitting device has excellent heat resistance and heat dissipation.

For example, a metal powder sintering paste containing spherical Cu powder having an average particle diameter of 3 μm or less, flat Cu powder having an aspect ratio of 3 or more and an average particle diameter of 10 μm or more, glass frit, and spherical inorganic powder that is made of an inorganic material that does not melt in a heat treatment process for burning and has an average particle diameter of 30 μm or more, the inorganic powder containing a ceramic-based material, is known as a metal powder sintering paste (for example, Japanese Patent 5962673). Also, a conductive composition containing silver nanoparticles in which the number average particle diameter of primary particles is 40 nm to 400 nm, a solvent, and thermoplastic resin particles in which the local maximum of an endothermic peak in the DSC chart obtained in measurement using differential scanning calorimetry is in the range of 80 to 170° C. is known (for example, WO 2016/063931).

SUMMARY

In the conductive material obtained after sintering of the metal powder sintering paste, the metals form a network, and therefore the elastic modulus is lower than in the case of bulk metal. However, the elastic modulus of such a conductive material tends to be higher than that of a conductive adhesive containing resin, such as silver paste. Thus, when a light-emitting element and a mounting member that have different coefficients of thermal expansion are bonded using such a conductive material, there are cases where the bonding strength will decrease due to a crack or fracture because even though thermal stress is applied, the conductive material is unlikely to deform due to having a high elastic modulus.

In view of this, the present embodiment provides a metal powder sintering paste having a high resistance to thermal stress, a method for producing the same, and a method for producing a conductive material using this metal powder sintering paste.

The metal powder sintering paste according to this embodiment contains silver particles having an average particle diameter (median diameter) of 0.3 μm to 5 μm as a main component, further contains inorganic spacer particles having a CV value (standard deviation/average value) of less than 5%, and contains substantially no resin.

The method for producing a metal powder sintering paste according to this embodiment includes mixing inorganic spacer particles having a CV value (standard deviation/average value) of less than 5% and silver particles having an average particle diameter (median diameter) of 0.3 μm to 5 μm together, and substantially not adding resin.

The method for producing a conductive material according to this embodiment includes a step of calcining the metal powder sintering paste.

Accordingly, it is possible to provide a metal powder sintering paste having a high resistance to thermal stress, a method for producing the same, and a method for producing a conductive material using this metal powder sintering paste.

DETAILED DESCRIPTION

Hereinafter, the present embodiment will be described by way of illustrative embodiments with reference to the drawings.

Hereinafter, a metal powder sintering paste, a method for producing a metal powder sintering paste, a conductive material, and a method for producing a conductive material of the present embodiment will be described.

The metal powder sintering paste according to this embodiment contains silver particles having an average particle diameter (median diameter) of 0.3 μm to 5 μm as a main component, further contains inorganic spacer particles having a CV value (standard deviation/average value) of less than 5%, and contains substantially no resin. The "CV value (coefficient of variation)" refers to the uniformity of the particle diameter, that is to say, a ratio of the standard deviation to the average particle diameter.

Formula: correlation coefficient (CV) %=(standard deviation÷average value of particle diameter)× 100       Equation 1

Also, the method for producing a metal powder sintering paste according to this embodiment includes mixing inorganic spacer particles having a CV value (standard deviation/average value) of less than 5% and silver particles having an average particle diameter (median diameter) of 0.3 μm to 5 μm together, and substantially not adding resin.

In the metal powder sintering paste of the present embodiment, the inorganic spacer particles having a CV value (standard deviation/average value) of less than 5% prevent the paste from being squashed during die bonding, and thus a thick layer of paste can be formed, as a result of which the deformation ratio during deformation caused by thermal stress can be reduced, and a decrease in the strength can be suppressed, and thereby, a highly reliable semiconductor device or the like can be produced.

A semiconductor element is also referred to as "chip". Semiconductors such as LSIs and ICs and semiconductor light-emitting elements such as LEDs and LDs can be used as the semiconductor element. The semiconductor element can be suitably used in a semiconductor element called power semiconductor having a large heat generation amount and a semiconductor light-emitting element that emits light in addition to heat.

Silver Particles

In the metal particles used in the metal powder sintering paste of the present embodiment, silver particles are the main component. That is, the metal particles contain silver particles in an amount of 70 mass % or more, for example, preferably 80 mass % or more, and more preferably 90 mass % or more. Note that the silver particles may contain oxidized silver particles in an amount of 10 mass % or less, for example, preferably 7 mass % or less, and more preferably 5 mass % or less.

Silver particles with one type of average particle diameter (median diameter) may be used, or silver particles with two or more types of average particle diameter may be mixed together. The silver particles have an average particle diameter (median diameter) of 0.3 μm to 5 μm, preferably 1.0 μm to 4 μm, and more preferably 1.5 μm to 3.5 μm. Accordingly, the electric resistance can be reduced. The metal particles other than the silver particles can be metal particles that have an average particle diameter (median diameter) of 0.1 μm to 15 μm, but metal particles having an average particle diameter of 0.3 μm to 10 μm are preferable, and metal particles having an average particle diameter of 0.3 μm to 5 μm are more preferable.

The silver particles preferably contain particles having a particle diameter of less than 0.3 μm in an amount of 5 mass % or less, and more preferably contain such particles in an amount of 4 mass % or less.

The silver particles preferably contain particles having a particle diameter of 0.5 μm or less in an amount of 15 mass % or less, and more preferably contain such particles in an amount of 10 mass % or less.

The average particle diameter (median diameter) of the silver particles can be measured through laser diffractometry. Note that the "average particle diameter (median diameter)" means a value where an accumulated frequency by volume is 50%, which is derived from a particle diameter distribution. Hereinafter, unless otherwise stated, the average particle diameter means the median diameter.

Also, the silver particles have a specific surface area of 0.4 $m^2/g$ to 1.5 $m^2/g$, preferably 0.6 $m^2/g$ to 0.9 $m^2/g$, and more preferably 0.66 $m^2/g$ to 0.74 $m^2/g$. Accordingly, the area of bonding of adjacent silver particles can be increased, and the paste can contain a large number of silver particles because the addition of the silver particles is unlikely to increase the viscosity. Accordingly, the occurrence of voids is suppressed, and a high bonding strength can be obtained. The specific surface area of the silver particles as a main material of the metal powder sintering paste can be measured using a BET method.

Although the shape of the silver particles is not limited, examples of the shape include a spherical shape, a flat shape, a flake shape, and a polyhedral shape, and a flake shape is preferable. The reason is as follows: the bonding area of adjacent silver particles increases due to a flake shape, and the electric resistance decreases. The shapes of the silver particles having an average particle diameter in a predetermined range are preferably uniform. In the case where silver particles of two or more types with different average particle diameters that are mixed together are used as the silver particles, the silver particles having different average particle diameters may have the same shape or different shapes. For example, when two types of silver particles having an average particle diameter of 3 μm and an average particle diameter of 0.3 μm are mixed together, the silver particles having an average particle diameter of 0.3 μm may have a spherical shape, while the silver particles having an average particle diameter of 3 μm may have a flat shape.

The metal powder sintering paste of the present embodiment contains silver particles as the main component. In the metal powder sintering paste of the present embodiment, one or more types of particles of metals such as gold, copper, platinum, palladium, rhodium, ruthenium, iridium, and osmium can be used as metal particles other than the silver particles.

The content of the silver particles is preferably 70 mass % or more, more preferably 85 mass % or more, and even more preferably 90 mass % or more, with respect to the paste. The reason is as follows: if the content of the silver particles is in a predetermined range, the bonding strength of the obtained conductive material increases.

Inorganic Spacer Particles

The metal powder sintering paste of the present embodiment contains inorganic spacer particles having a CV value (standard deviation/average value) of less than 5%. The inorganic spacer particles are preferably constituted by silica. The inorganic spacer particles are constituted by an inorganic substance, and thus there is a low possibility that they will undergo thermal decomposition when the metal powder sintering paste is calcined. Also, because the inorganic spacer particles are constituted by an inorganic substance, a volatile content that inhibits sintering is not generated when the metal powder sintering paste is calcined.

In order to function as the inorganic spacer particles, the inorganic spacer particles preferably have a uniform particle diameter. If the particle diameter is uniform and small particles are included, it is possible to suppress inclination of a chip disposed on the metal powder sintering paste and variation in the thickness of a sintered compact of the metal powder sintering paste, and it is possible to prevent a failure caused by the height of the metal powder sintering paste being out of a set range at the time of a process of assembly on a chip surface, and prevent insufficient resistance to thermal stress. The uniformity of the particle diameter of the inorganic spacer particles has a CV value (standard deviation/average value) of less than 5%, preferably less than 4%, and more preferably less than 3%. A smaller CV value means smaller variation in the particle diameter of the inorganic spacer particles. The CV value (standard deviation/average value) of the inorganic spacer particles can be measured using a Coulter counter, which has excellent resolution, for example.

The average particle diameter (median diameter) of the inorganic spacer particles is preferably 10 to 60 µm, more preferably 10 to 50 µm, and even more preferably 20 µm to 40 µm. The average particle diameter (median diameter) of the inorganic spacer particles is preferably 10 µm or more because the metal powder sintering paste with an appropriate thickness can be produced. Also, when the average particle diameter (median diameter) of the inorganic spacer particles is 60 µm or less, the ratio of the particles that function as the spacer is low and thus it is possible to prevent a decrease in the strength of a sintered compact of the metal powder sintering paste.

The average particle diameter (median diameter) of the inorganic spacer particles can be measured using a particle diameter distribution obtained using a laser diffraction/scattering method. Note that the "average particle diameter (median diameter)" means a value where an accumulated frequency by volume is 50%, which is derived from a particle diameter distribution. Hereinafter, unless otherwise stated, the average particle diameter means the median diameter.

It is sufficient that the amount of the added inorganic spacer particles is such that the concentration of the inorganic spacer particles in the metal powder sintering paste is 3 pcs per chip area (mm$^2$) or more, preferably 20 pcs per chip area (mm$^2$) or more, and more preferably 100 pcs per chip area (mm$^2$) or more, with respect to the area (mm$^2$) of a chip used. The reason is as follows: when the concentration of the inorganic spacer particles is 3 pcs/chip area or more, it is possible to suppress inclination of the chip disposed on the metal powder sintering paste and variation in the thickness of a sintered compact of the metal powder sintering paste. Here, "pcs" means the number of particles. Also, the amount of the added inorganic spacer particles is such that the concentration of the inorganic spacer particles in the metal powder sintering paste is preferably 10 vol % or less, and more preferably 5 vol % or less. The reason is as follows: when the concentration of the inorganic spacer particles in the metal powder sintering paste is 10 vol % or less, it is possible to prevent a decrease in the strength of a sintered compact to be obtained.

The concentration of the inorganic spacer particles can be recalculated as a weight ratio and used. Specifically, it is known that the specific gravity of a mixed material is obtained using Formula 1 below.

1/((weight ratio of material $A$/specific gravity of material $A$)+(weight ratio of material $B$/specific gravity of material $B$)+ ... )  [Formula 1]

Moreover, it is thought that when a spacer is used, the thickness of the metal powder sintering paste corresponds to the diameter of the spacer. Thus, the volume of the paste under the chip can be calculated using Formula 2 below.

Volume of paste under chip=chip area×diameter of spacer  [Formula 2]

Because the weight of the paste under the chip can be calculated by multiplying the volume of the paste under the chip by the specific gravity of the paste obtained using Formula 1, the total volume of the spacer under the chip is obtained using Formula 3 below.

Total volume of spacer under chip=volume of paste under chip×specific gravity of paste×(weight ratio of spacer/specific gravity of spacer)  [Formula 3]

The spacer vol % for setting an upper limit of the concentration can be calculated using Formula 4 below.

Concentration of particles (vol %)=total volume of spacer under chip×100/volume of paste under chip  [Formula 4]

Moreover, the volume of spacer particles can be calculated using particle diameters and Formula 5 below.

Volume of spacer particles=4×π×(particle diameter/2)×(particle diameter/2)×(particle diameter/2)/3  [Formula 5]

The concentration of particles (pcs/chip area) for setting a lower limit of the concentration is obtained using Formula 6 below.

Concentration of particles (pcs/chip area)=total volume of spacer under chip/volume of spacer particles  [Formula 6]

Although the concentration of particles is obtained through the above calculation using the weight ratio of the spacer, the weight ratio of the spacer corresponding to any concentration of particles can be obtained by the reverse of the calculation.

Surfactant

The metal powder sintering paste of the present embodiment may contain an anionic surfactant. The anionic surfactant exhibits field-based bleed resistance to a silver electrode or a gold electrode having a negative surface potential in general, due to an electric field generated by an anionic property, and thereby wire bonding failure caused by leakage to or contamination of a bottom surface of a substrate is improved, and an electronic component can be produced stably.

The surfactant is preferably highly volatile. Specifically, when the temperature is increased 2° C. per minute from about room temperature in TG-DTA (simultaneous thermogravimetry differential thermal analysis), the residue at 350° C. is preferably 20 mass % or less, and more preferably 5 mass % or less, with respect to the initial mass. The reason is as follows: when the residue is 20 mass % or less, a volatile residue does not inhibit sintering during calcining, and thus the bonding strength increases.

The anionic surfactant preferably is a carboxylic acid-type including a carboxyl group or a salt thereof and a carboxylic acid-type expressed by Formula (I) below is more preferable.

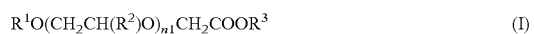

[where $R^1$ represents a linear or branched alkyl group having 7 or more carbon atoms, $R^2$ represents —H, —CH$_3$, —CH$_2$CH$_3$, or —CH$_2$CH$_2$CH$_3$, $R^3$ represents —H or an alkali metal, and n1 is in a range of 2 to 5.]

Also, the anionic surfactant is more preferably a carboxylic acid-type expressed by Formula (II) below.

$$R^{11}-C(O)N(R^{12})(CH_2)_{n2}COOR^{13} \quad (II)$$

[where $R^{11}$ represents a linear or branched alkyl group having 7 or more carbon atoms, $R^{12}$ represents —H, —CH$_3$, —CH$_2$CH$_3$, or —CH$_2$CH$_2$CH$_3$, $R^{13}$ represents —H, NH$^+$(C$_2$H$_4$OH)$_3$, or an alkali metal, and n2 is in a range of 1 to 5.]

Also, the anionic surfactant is more preferably a carboxylic acid-type expressed by Formula (III) below.

$$R^{21}-CH=CH-(CH_2)_{n3}COOR^{22} \quad (III)$$

[where $R^{21}$ represents a linear or branched alkyl group having 7 or more carbon atoms, $R^2$ is —H or an alkali metal, and n3 is in a range of 1 to 10.]

Also, the anionic surfactant is more preferably a carboxylic acid-type expressed by Formula (IV) below.

$$R^{31}-COOR^{32} \quad (IV)$$

[where $R^{31}$ represents a linear or branched alkyl group or alkoxy group that is optionally substituted with OH or COOR$^{33}$ ($R^{33}$ represents an alkali metal) and has 7 or more carbon atoms, and $R^{32}$ represents —H or an alkali metal.]

Also, the anionic surfactant is preferably a sulfonic acid-type including a sulfo group or salts thereof; and is more preferably a sulfonic acid-type expressed by Formula (V) below.

$$R^{41}-SO_3R^{42} \quad (V)$$

[where $R^{41}$ represents a linear or branched alkyl group, aralkyl group, or an alkenyl group that is optionally substituted with OH or COOR$^{43}$ ($R^{43}$ represents an alkyl group) and has 7 or more carbon atoms, or an aralkyl group, and $R^{42}$ represents —H or an alkali metal.]

Also, the anionic surfactant is preferably a carboxyl-sulfonic acid-type including both a carboxyl group or salts thereof, and a sulfo group or salts thereof and is more preferably carboxyl-sulfonic acid-type expressed by Formula (VI) below.

[Chemical Formula 1]

$$R^{51}-(CH_2CH_2O)n_5-CO-(CH_2)n_6-CH-SO_3R^{52} \atop \qquad\qquad\qquad\qquad\qquad\qquad | \atop \qquad\qquad\qquad\qquad\qquad (CH_2)n_7 \atop \qquad\qquad\qquad\qquad\qquad\quad | \atop \qquad\qquad\qquad\qquad\qquad COOR^{53}} \quad (VI)$$

[where $R^{51}$ represents a linear or branched alkoxy group having 7 or more carbon atoms, or $R^{54}$—CONH— ($R^{54}$ represents a linear or branched alkyl group having 7 or more carbon atoms), $R^{52}$ and $R^{53}$ represent —H or an alkali metal, n5 is in a range of 1 to 8, n6 is in a range of 0 to 1, and n7 is in a range of 0 to 1.]

Also, the anionic surfactant preferably has a phosphoric acid ester structure or is a phosphoric acid ester-type, which is a salt thereof, and is more preferably sulfuric acid ester-type expressed by Formula (VII) below.

[where $R^{61}$ and $R^{62}$ represents a linear or branched alkyl group, and $R^{63}$ represents —H or an alkali metal.]

An upper limit of the content of the surfactant is preferably 10 mass % with respect to the metal powder sintering paste of the present embodiment. Also, the content of the surfactant is preferably 2 mass % or less with respect to the metal powder sintering paste. The reason is as follows: the surfactant can be completely volatilized through calcining.

The surfactant is preferably a liquid at 2.5° C. This is because the paste can contain silver powder in a large amount because the solid content in the paste is reduced, and thus voids are unlikely to form in a sintered compact to be obtained.

Organic Solvent

The metal powder sintering paste of the present embodiment preferably contains an organic solvent as the dispersion medium. This is because, by uniformly dispersing silver particles in an organic solvent, the metal powder sintering paste can be applied with high quality and efficiency through a technique such as printing or dispensing.

Although some conventional metal powder sintering paste contains resin, in light of the fact that a high temperature is required in sintering and a resin component or its volatile content contaminates a peripheral member, the metal powder sintering paste of the present embodiment that contains no resin and contains a volatile organic solvent as the dispersion medium is excellent.

The dispersion medium may be one type of organic solvent or a mixture of two or more types of organic solvent, and a mixture of diol and ether is preferable. The reason is as follows: a semiconductor element and a mounting member can be bonded at a low temperature due to the metal powder sintering paste using such a dispersion medium.

The boiling point of the dispersion medium is preferably 300° C. or less, and more preferably 150° C. to 250° C. When the boiling point of the dispersion medium is in a range of 150° C. to 250° C., it is possible to suppress variation in the viscosity of the metal powder sintering paste at room temperature caused by volatilization of the dispersion medium, thereby improving the workability. Furthermore, when the boiling point of the dispersion medium is in this range, it is possible to allow the dispersion medium to volatilize completely through calcining.

Examples of the diol include aliphatic diols such as ethylene glycol, 1,3-propanediol, 1,4-butanediol, diethylene glycol, 1,5-pentanediol, 1,6-hexanediol, dipropylene glycol, triethylene glycol, tetraethylene glycol, 1,2-propanediol, 1,3-butanediol, 2,3-butanediol, neopentyl glycol (2,2-dimethylpropane-1,3-diol), 1,2-hexanediol, 2,5-hexanediol, 2-methyl-2,4-pentanediol, 3-methyl-1,3-pentanediol, and 2-ethyl-1,3-hexanediol; 2,2-bis(4-hydroxylcyclohexyl)propane, products obtained by adding alkylene oxide to 2,2-bis (4-hydroxycyclohexyl)propane; and alicyclic diols such as 1,4-cyclohexanediol and 1,4-cyclohexanedimethanol.

Examples of the ether include dipropylene glycol methyl ether, tripropylene glycol methyl ether, propylene glycol n-propyl ether, dipropylene glycol n-propyl ether, propylene glycol n-butyl ether, dipropylene glycol n-butyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether.

If the dispersion medium is a mixture of the diol and the ether, the mass ratio between the diol and the ether is preferably 7 to 9:2 (diol:ether). The reason is as follows: metal powder sintering paste using the mixture of such organic solvents makes it possible to bond a semiconductor element and a mounting member at a low temperature.

The content of the dispersion medium is not particularly limited because the necessary viscosity thereof varies with the methods of application of the metal powder sintering paste. In order to reduce the voidage of the bonding layer of the sintered compact obtained by calcining the metal powder sintering paste, the upper limit of the content of the dispersion medium with respect to the metal powder sintering paste is preferably 30 wt %.

Resin

The metal powder sintering paste of the present embodiment contains substantially no resin. Examples of the resin include binders such as an epoxy resin or a phenol resin, and curing agents such as a polyamide resin.

Method for Producing Metal Powder Sintering Paste

Also, a method for producing a metal powder sintering paste includes mixing inorganic spacer particles having a CV value (standard deviation/average value) of less than 5% and silver particles having an average particle diameter (median diameter) of 0.3 μm to 5 μm together, and substantially not adding resin, and this method will be described below. Note that the inorganic spacer particles, silver particles, and resin are as described in the metal powder sintering paste.

If the metal powder sintering paste of the present embodiment further contains a surfactant and a dispersion medium, the method for producing a metal powder sintering paste of the present embodiment includes mixing a surfactant, inorganic spacer particles having a CV value (standard deviation/average value) of less than 5%, silver particles having an average particle diameter (median diameter) of 0.3 μm to 5 μm, and a dispersion medium together, and substantially not adding resin. Note that the inorganic spacer particles, silver particles, resin, surfactant, and dispersion medium are as described in the metal powder sintering paste.

Mixing in the method for producing a metal powder sintering paste of the present embodiment can be carried out at room temperature, and preferably includes a degassing step. The degassing step makes it possible to prevent a decrease in the bonding strength of a chip and a mounting member caused by bubbles entering under the chip.

Metal Powder Sintering Paste

A metal powder sintering paste with which a conductive material having an electric resistance of 6 μΩ·cm or less is obtained through calcining using an air oven at 170° C. for 60 minutes is preferable.

Method for Producing Conductive Material

Also, a method for producing a conductive material of the present embodiment including a step of calcining a metal powder sintering paste will be described. In this method, a metal powder sintering paste is the metal powder sintering paste of the present embodiment.

Calcining Conditions

The calcining may be carried out in a non-oxidizing atmosphere, ambient atmosphere, vacuum atmosphere, oxygen atmosphere, or mixture gas atmosphere, but is preferably carried out in an atmosphere of oxygen or ozone, or ambient atmosphere. The reason is as follows: in the case where the calcining is carried out in the foregoing atmosphere, thermal diffusion of silver is accelerated, and it is possible to obtain a conductive material (sintered compact) having a higher sintering strength.

In the present embodiment, the calcining is preferably carried out at a temperature in a range of 160° C. to 300° C. The reason is as follows: in the case where the calcining is carried out at a temperature in the foregoing range, the metal bonding can be achieved at a temperature lower than the melting point of a resin package on which a semiconductor element or the like is mounted. Also, the calcining is more preferably carried out at a temperature in a range of 160° C. to 260° C., and even more preferably carried out at a temperature in a range of 170° C. to 195° C. The reason is as follows: a lead frame presuming a conventional adhesive containing resin includes a member that deteriorates at 200° C. or more.

The calcining is carried out for 10 minutes to 180 minutes, for example, and preferably for 30 minutes to 120 minutes.

The calcining is carried out at a temperature in a range of 160° C. to 300° C. for 10 minutes to 180 minutes, for example, and preferably for 30 minutes to 120 minutes.

Conductive Material

The conductive material of this embodiment is obtained by calcining the metal powder sintering paste of the present embodiment. The conductive material of the present embodiment preferably has an electric resistance of 50 μΩ·cm or less. This is because the lower the electric resistance is, the more power loss is suppressed in the case where the conductive material is used as an electrode, and the conductive material has excellent heat dissipation. The electric resistance is more preferably 10 μΩ·cm or less, and even more preferably 6 μΩ·cm or less.

Bonding Method

A method for bonding a chip and a substrate using the metal powder sintering paste of the present embodiment includes:

a step of applying the metal powder sintering paste onto the substrate;

a step of disposing the chip on the metal powder sintering paste; and a step of bonding the chip and the substrate by heating the substrate on which the metal powder sintering paste and the chip are disposed so as to sinter the metal powder sintering paste.

Heating Conditions

The heating may be carried out in a non-oxidizing atmosphere, ambient atmosphere, vacuum atmosphere, oxygen atmosphere, mixture gas atmosphere, or airflow, but is preferably carried out in an atmosphere of oxygen or ozone, or ambient atmosphere. The reason is as follows: in the case where the heating is carried out in the foregoing atmosphere, thermal diffusion of silver is accelerated, and it is possible to obtain a conductive material (sintered compact) having a higher sintering strength.

In the present embodiment, the calcining is preferably carried out at a temperature in a range of 160° C. to 300° C. The reason is as follows: in the case where the calcining is carried out at a temperature in the foregoing range, the metal bonding can be achieved at a temperature lower than the melting point of a resin package on which a semiconductor element or the like is mounted. Also, the calcining is more preferably carried out at a temperature in a range of 160° C. to 260° C., and even more preferably carried out at a temperature in a range of 170° C. to 195° C. The reason is as follows: a lead frame presuming a conventional adhesive containing resin includes a member that deteriorates at 200° C. or more.

The heating is carried out for 10 minutes to 180 minutes, for example, and preferably for 30 minutes to 120 minutes.

The heating is carried out at a temperature in a range of 160° C. to 300° C. for 10 minutes to 180 minutes, for example, and preferably for 30 minutes to 120 minutes.

According to the bonding method, use of the metal powder sintering paste of the present embodiment makes it possible to suppress inclination of the chip and variation in the thickness of a sintered compact.

WORKING EXAMPLES

Hereinafter, the metal powder sintering paste, method for producing a metal powder sintering paste, conductive material, and method for producing a conductive material according to the present embodiment will be described based on working examples, comparative examples, and reference examples.

Comparative Example 1

2-ethyl-1,3-hexanediol (0.57 g) and diethylene glycol monobutyl ether (0.14 g), which are organic solvents, and an anionic liquid surfactant (product name "BEAULIGHT LCA-H", laureth-5-carboxylic acid, manufactured by Sanyo Chemical Industries, Ltd., liquid state at 25° C., 0.09 g) were stirred using a planetary centrifugal mixer (trade name "THINKY CORPORATION MIXER AR-250" manufactured by THINKY CORPORATION) for one minute and then stirred using one cycle of degassing for 15 seconds so as to obtain a solvent mixture.

Flake-shaped silver particles (product name "AgC-239" manufactured by Fukuda Metal Foil & Powder Co., Ltd., a flake shape, an average particle diameter (median diameter) was 2.7 μm, a specific surface area was 0.7 m²/g, the content of particles having a particle diameter of less than 0.3 μm was 1 mass %, the content of particles having a particle diameter of 0.5 μm or less was 3 mass %, 9.19 g) were weighed and added to the solvent mixture. The obtained mixture was stirred using a planetary centrifugal mixer (trade name "THINKY CORPORATION MIXER AR-250" manufactured by THINKY CORPORATION) for one minute and stirred using one cycle of degassing for 15 seconds so as to obtain a metal powder sintering paste (10 g) (the content of silver particles was 91.9 mass %).

Working Example 1

2-ethyl-1,3-hexanediol (0.57 g) and diethylene glycol monobutyl ether (0.14 g), which were organic solvents, and an anionic liquid surfactant (product name "BEAULIGHT LCA-H", laureth-5-carboxylic acid, manufactured by Sanyo Chemical Industries, Ltd., liquid state at 25° C., 0.09 g) were stirred using a planetary centrifugal mixer (trade name "THINKY CORPORATION MIXER AR-250" manufactured by THINKY CORPORATION) for one minute and then stirred using one cycle of degassing for 15 seconds so as to obtain a solvent mixture.

Flake-shaped silver particles (product name "AgC-239" manufactured by Fukuda Metal Foil & Powder Co., Ltd., a flake shape, an average particle diameter (median diameter) was 2.7 μm, a specific surface area was 0.7 m²/g, the content of particles having a particle diameter of less than 0.3 μm was 1 mass %, the content of particles having a particle diameter of 0.5 μm or less was 3 mass %, 9.16 g) and spherical silica spacers (product name "HIPRESICA TS" manufactured by UBE EXSYMO CO., LTD., an average particle diameter (median diameter) was 31.14 μm in measurement using a Coulter counter, a CV value was 1.92%, 0.03 g) were weighed and added to the solvent mixture. The obtained mixture was stirred using a planetary centrifugal mixer (trade name "THINKY CORPORATION MIXER AR-250" manufactured by THINKY CORPORATION) for one minute and then stirred using one cycle of degassing for 15 seconds so as to obtain a metal powder sintering paste (10 g) (the content of silver particles was 91.6 mass % and the concentration of spacer particles was 0.94 vol %, corresponding to 214 pcs/chip area).

Working Example 2

A metal powder sintering paste (10 g) (the content of silver particles was 91.0 mass %, the concentration of spacer particles was 2.62 vol %, corresponding to 214 pcs/chip area) was obtained by carrying out processes similarly to Working Example 1, except that spherical silica spacers (product name "HIPRESICA TS" manufactured by UBE EXSYMO CO., LTD., an average particle diameter (median diameter) was 50.8 μm in measurement using a Coulter counter, a CV value was 1.1%, 0.09 g) were used instead of the spherical silica spacers (product name "HIPRESICA TS" manufactured by UBE EXSYMO CO., LTD., an average particle diameter (median diameter) was 31.14 μm, a CV value was 1.92%, 0.03 g).

Conductive Material

The metal powder sintering paste obtained in Comparative Example 1, Working Example 1 or 2 was applied using a dispensing method to a copper frame having gold on its surface, and a submount chip having silver electrode on its back side, having an outer perimeter of 4650 μm×2300 μm and a thickness of 400 μm, and whose base material is aluminum nitride was mounted thereon. A semiconductor light-emitting element was mounted on the submount chip. The substrate on which the submount chip was mounted via the metal powder sintering paste was heated using an air oven at 185° C. for 120 minutes, and then cooled. After cooling, the difference in height between the submount surface and the frame surface was measured using an optical measurement microscope, and the thickness of the paste was calculated using the thickness of the submount. Thereafter, half of the substrate on which the submount chip was mounted via the heated metal powder sintering paste was introduced into a high temperature and high humidity tank at 85° C. and 85% for 24 hours, and a reflow path was carried out at 260° C. for 10 seconds. This moisture absorption reflow test was carried out twice in total. Thereafter, a shear force was applied to both a sample before moisture absorption reflow test and a sample after test in a direction in which the submount chip separates from the substrate, and the strength at which the submount chip separated therefrom was measured as the bonding strength.

Also, the metal powder sintering paste obtained in Comparative Example 1, Working Example 1 or 2 was applied to a glass substrate (thickness was 1 mm) using a screen printing method such that the thickness of the metal powder sintering paste was 100 μm. The glass substrate to which the metal powder sintering paste was applied was heated using an air oven at 185° C. for 120 minutes, and then cooled. The electric resistance of the obtained wiring film (conductive material) was measured through four-terminal sensing using product name "MCP-T600" (manufactured by Mitsubishi Chemical Corporation).

Table 1 shows the blending ratio, the thickness of the pastes, measurement results in a die shear test before and after a moisture absorption reflow test, and the results of measurement of the electric resistance of Comparative Example 1, and Working Examples 1 and 2.

TABLE 1

|  |  | Comparative Example 1 | Working Example 1 | Working Example 2 |
|---|---|---|---|---|
| Particle diameter of spacer | | not added | 30 μm | 50 μm |
| Spacer addition ratio (number of spacers/chip area) (pcs/mm²) | | — | 20 | 90 |
| Spacer addition ratio (volume of spacer/volume of metal powder sintering paste) (vol %) | | — | 0.94 | 2.62 |
| Filler ratio (weight of filler/weight of metal powder sintering paste) (wt %) | | 91.9 | 91.9 | 91.9 |
| Blending ratio in filler (wt %) | silver powder | 100 | 99.65 | 99.00 |
| | spacer | not added | 0.35 | 1.00 |
| Ratio of surfactant added to filler (wt %) | | 1 | 1 | 1 |
| Blending ratio in dispersion medium (wt %) | diol | 80 | 80 | 80 |
| | ether | 20 | 20 | 20 |
| Thickness of formed (heated) paste (μm) | | 31 | 53 | 71 |
| Die shear measurement result before and after moisture absorption reflow test (bonding strength) | before reflow (N) | 266 | 223 | 120 |
| | after reflow (N) | 236 | 245 | 129 |
| | maintenance percentage before and after test(%) | 89 | 110 | 108 |
| Electric resistance (μΩ · cm) | | 3.6 | 3.8 | 4.0 |

As shown in Table 1, compared to Comparative Example 1 in which spacer particles were not added, both Working Examples 1 and 2 in which spacer particles were added had a high die shear strength maintenance percentage before and after a moisture absorption reflow test, and improvement was found. Also, a correlational relationship between the particle diameter and the thickness of the paste was found. In Working Examples 1 and 2, the electric resistance was also kept at a sufficiently small value.

The metal powder sintering paste according to an embodiment makes it possible to form a thick layer of paste and reduce the deformation ratio at the time of expansion and contraction due to thermal stress, and thus it is possible to suppress a decrease in the bonding strength in moisture absorption reflow test.

The metal powder sintering paste of the present embodiment can be used for the purpose of producing heat-resistant power wiring, component electrodes, die attaches, microbumps, flat panels, solar wiring, and the like, the purpose of wafer bonding, and the purpose of producing electronic components produced with use of these in combination. The method for producing a conductive material according to the present embodiment also can be used for, for example, producing a light-emitting device in which a semiconductor light-emitting element such as LED or LD is used.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A metal powder sintering paste,
comprising silver particles having an average particle diameter (a median diameter) of 0.3 μm to 5 μm as a main component,
further comprising inorganic spacer particles having a coefficient of variation (CV) value (a standard deviation/an average value) of less than 5%, and
comprising substantially no resin, and
wherein the inorganic spacer particles have an average particle diameter (a medium diameter) of 10 to 60 μm.

2. The metal powder sintering paste according to claim 1, wherein the inorganic spacer particles are made of silica.

3. The metal powder sintering paste according to claim 1, wherein the silver particles have a flake shape.

4. The metal powder sintering paste according to claim 1, further comprising:
an organic solvent as a dispersion medium.

5. The metal powder sintering paste according to claim 4, wherein a boiling point of the organic solvent is in a range of 150 to 250° C.

6. The metal powder sintering paste according to claim 1, wherein the content of the silver particles is 70 mass % or more with respect to the paste.

7. A method for producing the metal powder sintering paste according to claim 1, comprising:
mixing inorganic spacer particles having a coefficient of variation (CV) value (a standard deviation/an average value) of less than 5% and silver particles having an average particle diameter (a median diameter) of 0.3 μm to 5 μm together, and substantially not adding resin, and
wherein the inorganic spacer particles have an average particle diameter (a median diameter) of 10 to 60 μm.

8. A method for producing a conductive material, comprising
a step of calcining the metal powder sintering paste according to claim 1.

9. The method for producing a conductive material according to claim 8,
wherein the calcining is carried out at a temperature in a range of 160° C. to 300° C.

10. The method for producing a conductive material according to claim 8,
wherein the calcining is carried out in an air oven at 160° C. to 250° C. for 30 to 120 minutes.

11. A metal powder sintering paste,
comprising silver particles having an average particle diameter (a median diameter) of 0.3 μm to 5 μm as a main component,
further comprising inorganic spacer particles having a coefficient of variation (CV) value (a standard deviation/an average value) of less than 5%,
comprising substantially no resin, and
wherein the silver particles contain particles having an average particle diameter (a median diameter) of less than 0.3 μm in an amount of 5 mass % or less.

12. The metal powder sintering paste according to claim 11,
wherein the silver particles contain particles having an average particle diameter (a median diameter) of 0.5 μm or less in an amount of 15 mass % or less.

13. A method for producing the metal powder sintering paste according to claim 11, comprising:
mixing inorganic spacer particles having a coefficient of variation (CV) value (a standard deviation/an average value) of less than 5% and silver particles having an average particle diameter (a median diameter) of 0.3 µm to 5 µm together, and substantially not adding resin.

14. A method for producing a conductive material, comprising a step of calcining the metal powder sintering paste according to claim 11.

15. The method for producing a conductive material according to claim 14, wherein the calcining is carried out in an air oven at 160° C. to 250° C. for 30 to 120 minutes.

16. A metal powder sintering paste, comprising silver particles having an average particle diameter (a median diameter) of 0.3 µm to 5 µm as a main component, further comprising inorganic spacer particles having a coefficient of variation (CV) value (a standard deviation/an average value) of less than 5%, comprising substantially no resin, and wherein an electric resistance of a conductive material achieved by sintering the metal powder sintering paste is 6 µΩ·cm or less.

17. A method for producing the metal powder sintering paste according to claim 16, comprising:

mixing inorganic spacer particles having a coefficient of variation (CV) value (a standard deviation/an average value) of less than 5% and silver particles having an average particle diameter (a median diameter) of 0.3 µm to 5 µm together, and substantially not adding resin.

18. A method for producing a conductive material, comprising a step of calcining the metal powder sintering paste according to claim 16.

19. The method for producing a conductive material according to claim 18, wherein the calcining is carried out in an air oven at 160° C. to 250° C. for 30 to 120 minutes.

* * * * *